(12) United States Patent
Jang

(10) Patent No.: US 8,390,342 B2
(45) Date of Patent: Mar. 5, 2013

(54) HIGH VOLTAGE SWITCH CIRCUIT OF SEMICONDUCTOR DEVICE

(75) Inventor: Chae Kyu Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 122 days.

(21) Appl. No.: 12/982,810

(22) Filed: Dec. 30, 2010

(65) Prior Publication Data

US 2011/0156796 A1  Jun. 30, 2011

(30) Foreign Application Priority Data

Dec. 31, 2009  (KR) .................. 10-2009-0135618
Dec. 8, 2010  (KR) .................. 10-2010-0125006

(51) Int. Cl.
*H03B 1/00* (2006.01)
*H03K 3/00* (2006.01)

(52) U.S. Cl. ......... 327/112; 327/108; 327/436; 327/535

(58) Field of Classification Search .................. 327/108, 327/112, 436, 535
See application file for complete search history.

(56) References Cited

U.S. PATENT DOCUMENTS 5,907,255 A * 5/1999 Churchill .............. 327/262

FOREIGN PATENT DOCUMENTS

| KR | 1020040070355 A | 8/2004 |
|----|----|----|
| KR | 1020050086289 A | 8/2005 |
| KR | 1020060019073 A | 3/2006 |

* cited by examiner

*Primary Examiner* — John Poos
(74) *Attorney, Agent, or Firm* — William Park & Associates Ltd.

(57) ABSTRACT

A high voltage switch circuit of a semiconductor device includes a buffer circuit configured to output a control signal in response to an input signal and a boost circuit configured to output a block selection signal to an output terminal by connecting a current path between a voltage supply node and the output terminal in response to the control signal, and to block the current path in case where the control signal falls from a high voltage level to a low voltage level.

18 Claims, 2 Drawing Sheets

HIGH VOLTAGE SWITCH CIRCUIT OF SEMICONDUCTOR DEVICE

CROSS-REFERENCE TO RELATED APPLICATION

Priority to Korean patent application number 10-2009-0135618 filed on Dec. 31, 2009 and priority to Korean patent application number 10-2010-0125006 filed on Dec. 8, 2010, the entire disclosure of which are incorporated by references herein, are claimed.

BACKGROUND

Exemplary embodiments relate to the high voltage switch circuit of a semiconductor device and, more particularly, to the high voltage switch circuit of a semiconductor device, which is capable of performing a normal operation even when an internal voltage becomes a low voltage level.

An exemplary semiconductor device including a high voltage switch circuit, from among semiconductor devices, is described below.

The semiconductor device includes a controller for outputting a high voltage switch enable signal in response to an address, a plurality of high voltage switch circuits for outputting a block selection signal in response to the high voltage switch enable signal, and a plurality of block switches for transferring a high voltage to a selected memory cell block in response to the block selection signal.

When a high voltage switch circuit selected from among the high voltage switch circuits is activated and the remaining unselected high voltage switch circuits are inactivated, the activated high voltage switch circuit may output the block selection signal of a high level, and the unselected high voltage switch circuits may output the block selection signal of a low level.

Recently, in order to reduce a voltage drop of the block selection signal which is an output signal of the high voltage switch circuit, the high voltage switch circuit consists of a high voltage transistor and a negative transistor having a negative threshold voltage.

More particularly, the high voltage switch circuit includes a boost circuit for outputting the block selection signal of a high voltage when the high voltage switch circuit is activated. The boost circuit may include the negative transistor and the high voltage transistor coupled in series. The high voltage transistor may be a high voltage PMOS transistor, and the negative transistor may be a negative NMOS transistor.

Here, when the high voltage switch circuit is activated, the high voltage PMOS transistor is turned on, and when the high voltage switch circuit is inactivated, the high voltage PMOS transistor is turned off. That is, when the high voltage PMOS transistor is turned on, the feedback loop of the boost circuit becomes formed and so a level of the block selection signal rises, and when the high voltage PMOS transistor is turned off, the feedback loop is not formed and so an output node is discharged. Accordingly, the block selection signal of a low level is outputted.

Meanwhile, in order to fully turn off the high voltage PMOS transistor, a sufficiently high level voltage is supplied to the gate of the high voltage PMOS transistor. However, if the level of the turn-on voltage becomes lowered (for example, the level of the internal voltage becomes lowered), the high voltage PMOS transistor may be slightly turned on, and so a channel may be formed. That is, the voltage level of a source of the high voltage PMOS transistor may rise. The source of the high voltage PMOS transistor is coupled to the gate of the negative NMOS transistor so that the feedback loop is formed. Thus, if the voltage level of a source of the high voltage PMOS transistor rises, the turn-on voltage of the negative NMOS transistor also rises. Accordingly, the feedback loop may be formed in operations in which the feedback loop should not be formed, and so the high voltage switch circuit may not perform a normal operation. Consequently, reliability of the high voltage switch circuit may be deteriorated in a low voltage level.

BRIEF SUMMARY

Exemplary embodiments relate to the high voltage switch circuit of a semiconductor device, which is capable of performing a normal operation even in a low voltage level.

The high voltage switch circuit of a semiconductor device according to an exemplary embodiment of the present invention includes a buffer circuit configured to output a control signal in response to an input signal, and a boost circuit configured to output a block selection signal to an output terminal by connecting a current path between a voltage supply node and the output terminal in response to the control signal, and to block the current path in case where the control signal falls from a high voltage level to a low voltage level.

A high voltage switch circuit of a semiconductor device according to another exemplary embodiment of the present invention includes a buffer circuit configured to generate an initial signal and a control signal in response an input signal, an initial voltage setup circuit configured to set up an initial voltage of an output terminal in response to the initial signal, a first switch configured to transfer a high voltage to a first node in response to a voltage level of the output terminal, a second switch configured to transfer a voltage level of the first node to a second node in response to the control signal, a block switch configured to block a current path between the second node and the output terminal in response to a voltage level of the high voltage, and a discharge circuit configured to discharge the output terminal via the initial voltage setup circuit in response to the input signal.

DESCRIPTION OF EMBODIMENTS

Hereinafter, some exemplary embodiments of the present invention will be described in detail with reference to the accompanying drawings. The figures are provided to allow those having ordinary skill in the art to understand the scope of the embodiments of the invention.

Figure 1:
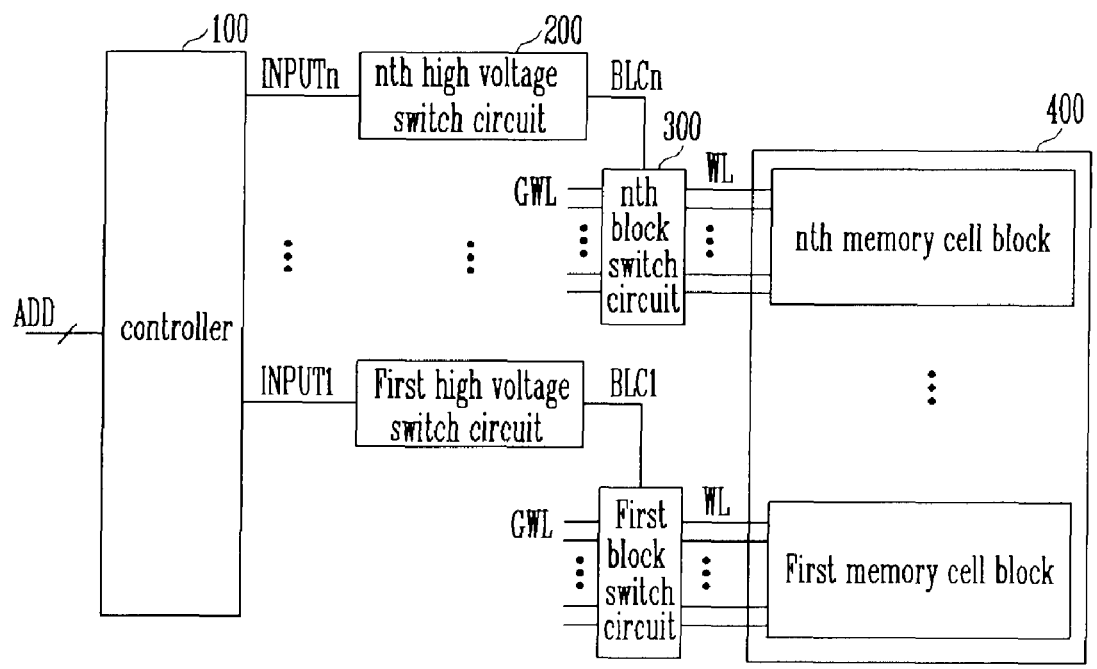
FIG. 1 is a block diagram illustrating a semiconductor device.

FIG. 1 is a block diagram illustrating a semiconductor device.

The semiconductor device includes a controller 100, first to $n^{th}$ high voltage switch circuits 200, and first to $n^{th}$ block switch circuits 300. The controller outputs various operating signals in response to an address ADD. The first to $n^{th}$ high voltage switch circuits 200 are selected in response to respective input signals INPUT1 to INPUTn from among a plurality of the signals outputted by the controller 100. The first to $n^{th}$ block switch circuits 300 transfer driving voltages to a selected memory cell block in response to respective block selection signals BLC1 to BLCn outputted by the selected high voltage switch circuit 200. First to $n^{th}$ memory cell blocks form a memory cell array 400.

In case where the first memory cell block is selected and operated, the controller 100 outputs the input signal INPUT1 of a low level to a selected high voltage switch circuit 200, and outputs the input signal of a high level to the remaining unselected high voltage switch circuits, in response to the address ADD. That is, the high voltage switch circuits 200, to which the input signals INPUT1 to INPUTn of a low level are supplied, are activated, and the high voltage switch circuits 200, to which the input signals INPUT1 to INPUTn of a high level are supplied, are inactivated.

The activated first high voltage switch circuit 200 outputs the first block selection signal BLC1 of a high voltage. In response to the block selection signal BLC1, the first block switch circuit is activated, and so global word lines GWL and the word lines WL of the first memory cell block are electrically connected. Accordingly, various driving voltages are supplied to the word lines of the first memory cell block.

The remaining inactivated high voltage switch circuits output the block selection signals of a low level, and so the corresponding block switch circuits are also inactivated. Accordingly, the global word lines GWL and of the word lines WL of unselected memory cell blocks are not electrically coupled.

A high voltage switch circuit 200 proposed by this disclosure is described below in detail.

Figure 2:
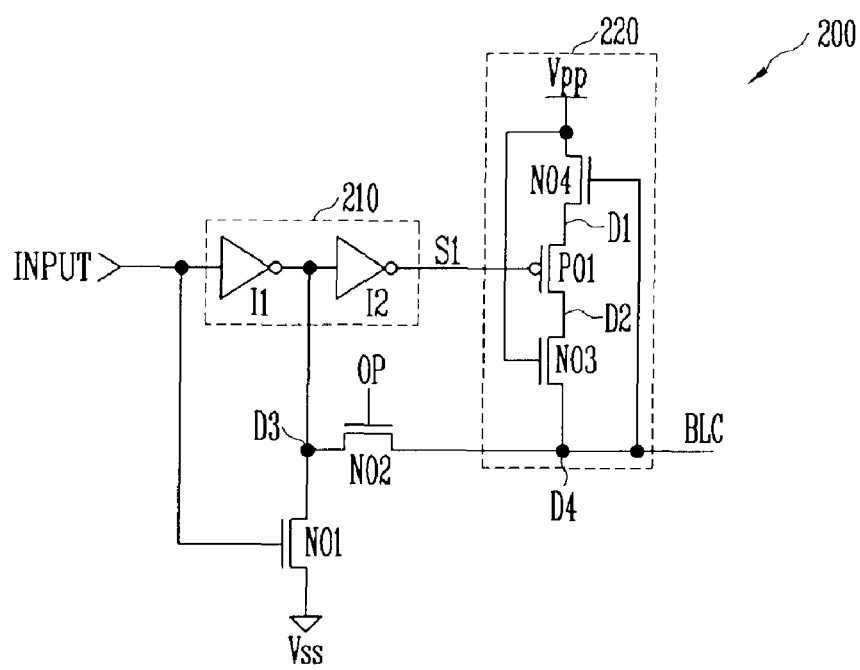
FIG. 2 is a circuit diagram of a high voltage switch circuit according to an exemplary embodiment of present invention.

FIG. 2 is a circuit diagram of the high voltage switch circuit according to an exemplary embodiment of the present invention.

Referring to FIG. 2, the high voltage switch circuit 200 includes a buffer circuit 210, a boost circuit 220, a discharge circuit N01, and an initial voltage setup circuit N02.

The buffer circuit 210 includes first and second inverters I1 and I2 for buffering the input signal INPUT. The first and second inverters I1 and I2 are coupled in series.

When a control signal S1 of a low level is received from the buffer circuit 210, the boost circuit 220 raises the voltage level of an output terminal D4 using an external high voltage Vpp, and outputs the block selection signal BLC of a high voltage. Meanwhile, if a voltage level of the high voltage Vpp is temporarily lowered because of external factors, the boost circuit 220 functions to block a current path between the external high voltage Vpp terminal and the output terminal D4.

More particularly, the boost circuit 220 includes a first switch N04, a block switch N03, and a second switch P01.

The second switch P01 is configured to be operated in response to the control signal S1 of the buffer circuit 210, and to couple a first node D1 and a second node D2. The second switch P01 may be a high voltage PMOS transistor. The high voltage Vpp is supplied to the gate of the block switch N03. The block switch N03 is coupled between the second node D2 and the output terminal D4, and may be an NMOS transistor. In particular, if power is turned off or a voltage level of the high voltage Vpp is temporarily lowered because of external factors, the block switch N03 is turned off. The first switch N04 is coupled between the first node D1 and the terminal from which the high voltage Vpp is supplied. The first switch N04 is operated in response to a voltage level of the output terminal D4, and may be a negative NMOS transistor having a negative (−) threshold voltage. For example, in case where the threshold voltage of the negative NMOS transistor is −2.8 V, if voltage higher than −2.8 V is supplied to the gate of the negative NMOS transistor, a channel is formed in the negative NMOS transistor. Accordingly, although voltage of 0 V is supplied to the gate of the negative NMOS transistor, the negative NMOS transistor is turned on. With an increase in the voltage supplied to the output terminal D4, a voltage transferred to the first node D1 through the first switch N04 increases, and thus the feedback loop of the boost circuit 220 becomes formed.

The discharge circuit N01 is coupled between a third node D3 and a ground terminal Vss in order to more effectively discharge the output terminal D4 (that is, the output terminal of the boost circuit 220) when the input signal INPUT is in a high level. The discharge circuit N01 may be an NMOS transistor.

The initial voltage setup circuit N02 is operated in order to set up a voltage level of the output terminal D4 when the high voltage switch circuit is activated, and coupled between the third node D3 and the output terminal D4. If voltage supplied to the output terminal D4 abruptly rises, the initial voltage setup circuit N02 functions to protect the buffer circuit 210 from being damaged by the risen voltage supplied to the buffer circuit 210. Here, the third node D3 is a node between the first inverter I1 and the second inverter I2. The initial voltage setup circuit N02 may be a negative NMOS transistor operated in response to an operating signal OP. The operating signal OP is in a high level when the high voltage switch circuit is activated, and in a low level when the high voltage switch circuit is inactivated. However, since the initial voltage setup circuit N02 is a negative NMOS transistor, the initial voltage setup circuit N02 remains turned on until the operating signal OP drops to the negative (−) threshold voltage level.

The operations of the high voltage switch circuit 200 are described below.

When the high voltage switch circuit 200 is activated in response to the input signal INPUT of the low level, the buffer circuit 210 outputs the control signal S1 of a low level. Here, since the input signal INPUT of a low level is also supplied to the gate of the discharge circuit N01, the discharge circuit N01 is turned off. Voltage of a high level is supplied to the third node D3 through the first inverter I1.

The initial voltage setup circuit N02 is turned on when the operating signal OP is in a high level, and couples the third node D3 and the output terminal D4. With an increase in the voltage level of the operating signal OP, an initial voltage of the output terminal D4 also rises. In other words, the initial voltage of the output terminal D4 is determined by the voltage level of the operating signal OP.

When the input signal INPUT is in a low level, the control signal S1 of the buffer circuit 210 becomes a low level, and so the second switch P01 is turned on. Thus, the first node D1 and the second node D2 are coupled. The first switch N04 is turned on according to a voltage level of the output terminal D4 in which the initial voltage has been set up, thus raising the voltage level of the first node D1. Since both the second switch P01 and the block switch N03 are turned on, a feedback loop is formed in the boot circuit 220. Accordingly, since the voltage level of the output terminal D4 gradually becomes high, the boost circuit 220 can output the block selection signal BLC of a high voltage.

In particular, in case where power is turned off or a level of the high voltage Vpp is temporarily lowered because of external factors in the state in which the high voltage switch circuit 200 has been activated, the block switch N03 may function to electrically block the connection of the output node D4 and the second node D2. More particularly, the block switch N03 is turned on or off according to a level of the high voltage Vpp.

Therefore, if a level of the high voltage Vpp is temporarily lowered as described above, the block switch N03 may be turned off. Accordingly, a current path between the high voltage Vpp terminal and the output node D4 may be blocked.

An operation when the high voltage switch circuit 200 is inactivated is described below.

When the high voltage switch circuit 200 is inactivated in response to the input signal INPUT of a high level, the buffer circuit 210 outputs the control signal S1 of a high level. Here, since the input signal INPUT of a high level is also supplied to the gate of the discharge circuit N01, the discharge circuit N01 is turned on, and so the third node D3 is discharged.

The initial voltage setup circuit N02 may be a negative NMOS transistor as described above. Accordingly, the initial voltage setup circuit N02 can maintain a turn-on state although the operating signal OP becomes a low voltage level. Thus, the output terminal D4 is also discharged because the third node D3 and the output terminal D4 are coupled.

Since the input signal INPUT is in a high level, the control signal S1 of the buffer circuit 210 also becomes a high level. Thus, the second switch P01 becomes turned off. Here, a voltage level of the control signal S1 supplied to the gate of the second switch P01 is determined depending on an internal voltage supplied to the second inverter I2 (for example, Vcc).

Figure 3:
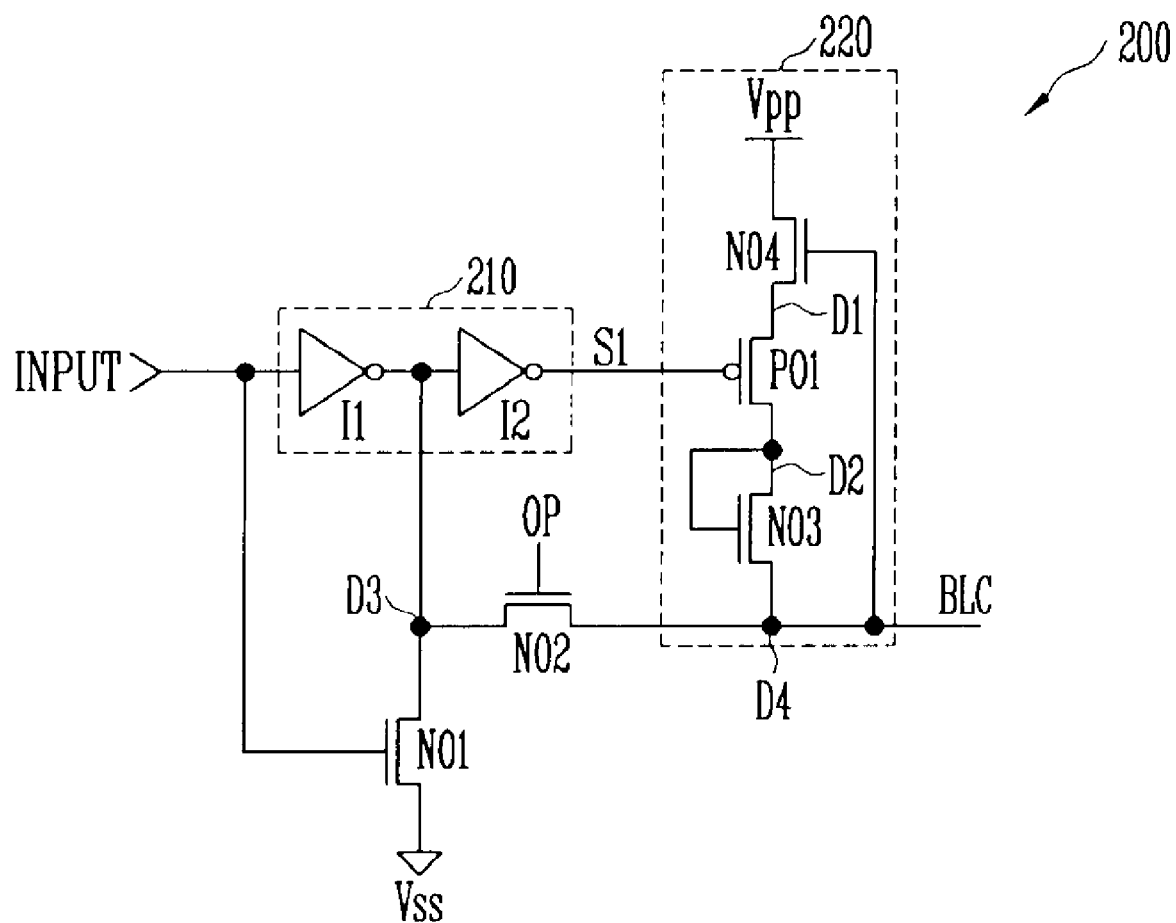
FIG. 3 is a circuit diagram of a high voltage switch circuit according to another exemplary embodiment of present invention.

FIG. 3 is a circuit diagram of the high voltage switch circuit according to another exemplary embodiment of present invention.

Referring to FIG. 3, the high voltage switch circuit 200 includes a buffer circuit 210, a boost circuit 220, a discharge circuit N01, and an initial voltage setup circuit N02.

The buffer circuit 210 includes first and second inverters I1 and I2 for buffering the input signal INPUT. The first and second inverters I1 and I2 are coupled in series.

When a control signal S1 of a low level is received from the buffer circuit 210, the boost circuit 220 raises the voltage level of an output terminal D4 using an external high voltage Vpp, and outputs a block selection signal BLC of a high voltage. Meanwhile, when the control signal S1 of a high level is received from the buffer circuit 210, a current path between the external high voltage Vpp terminal and the output terminal D4 is not formed in the boost circuit 220, and so the output terminal D4 is inactivated (that is, a floating state).

More particularly, the boost circuit 220 includes a first switch N04, a block switch N03, and a second switch P01. The second switch P01 is configured to be operated in response to the control signal S1 of the buffer circuit 210, and to couple a first node D1 and a second node D2. The block switch N03 transfers voltage of the second node D2 to the output terminal D4. The first switch N04 is coupled between a terminal for the high voltage Vpp and the first node D1, and configured to transfer a voltage, which increase with an increase in the voltage supplied to the output terminal D4, to the first node D1.

The second switch P01 may be a high voltage PMOS transistor and operated in response to the control signal S1 of the buffer circuit 210. The block switch N03 may be a high voltage NMOS transistor and operated in response to voltage of the second node D2. The first switch N04 may be a negative NMOS transistor and operated in response to voltage of the output terminal D4. The negative NMOS transistor is a transistor having a negative (−) threshold voltage. For example, in case where the threshold voltage of the negative NMOS transistor is −2.8 V, if voltage higher than −2.8 V is supplied to the gate of the negative NMOS transistor, a channel is formed in the negative NMOS transistor. Accordingly, the negative NMOS transistor is turned on although voltage of 0 V is supplied to the gate of the negative NMOS transistor.

The discharge circuit N01 is coupled between a third node D3 and a ground terminal Vss in order to more effectively discharge the output terminal D4 (that is, the output terminal of the boost circuit 220) when the input signal INPUT is a high level. The discharge circuit N01 may be an NMOS transistor.

The initial voltage setup circuit N02 is coupled between the third node D3 and the output terminal D4, and configured to set up a voltage level of the output terminal D4 when the high voltage switch circuit is activated. Furthermore, if voltage supplied to the output terminal D4 abruptly rises, the initial voltage setup circuit N02 functions to protect the buffer circuit 210 from being damaged by the risen voltage supplied to the buffer circuit 210. Here, the third node D3 is a node between the first inverter I1 and the second inverter I2. The initial voltage setup circuit N02 is operated in response to an operating signal OP and may be a negative NMOS transistor. The operating signal OP is in a high level when the high voltage switch circuit is activated and in a low level when the high voltage switch circuit is inactivated. However, since the initial voltage setup circuit N02 is a negative NMOS transistor, the initial voltage setup circuit N02 remains turned on until the operating signal OP drops to the negative (−) threshold voltage.

The operations of the high voltage switch circuit 200 are described below.

When the high voltage switch circuit 200 is activated in response to the input signal INPUT of the low level, the buffer circuit 210 outputs the control signal S1 of a low level. Here, since the input signal INPUT of a low level is also supplied to the gate of the discharge circuit N01, the discharge circuit N01 is turned off. Voltage of a high level is supplied to the third node D3 through the first inverter I1.

Since the operating signal OP is in a high level, the initial voltage setup circuit N02 is turned on, and so the third node D3 and the output terminal D4 are coupled. Here, an initial voltage level of the output terminal D4 rises with an increase of a voltage level of the operating signal OP. That is, the initial voltage of the output terminal D4 is determined depending on the voltage level of the operating signal OP.

When the input signal INPUT is in a low level, the control signal S1 of the buffer circuit 210 becomes a low level, and so the second switch P01 is turned on. Accordingly, the first node D1 and the second node D2 are coupled. The first switch N04 is turned on according to a voltage level of the output terminal D4 in which the initial voltage is set up, thus raising a voltage level of the first node D1. Since both the second switch P01 and the block switch N03 are turned on, a current path between the external high voltage Vpp terminal and the output terminal D4 is formed in the boot circuit 220. Accordingly, since a voltage level of the output terminal D4 becomes gradually high, the boost circuit 220 can output the block selection signal BLC of a high voltage.

An operation when the high voltage switch circuit 200 is inactivated is described below.

When the high voltage switch circuit 200 is inactivated in response to the input signal INPUT of a high level, the buffer circuit 210 outputs the control signal S1 of a high level. Here, since the input signal INPUT of a high level is also supplied to the gate of the discharge circuit N01, the discharge circuit N01 is turned on and so the third node D3 is discharged.

The initial voltage setup circuit N02 is a negative NMOS transistor as described above. Accordingly, the initial voltage setup circuit N02 can maintain a turn-on state although the operating signal OP becomes a low voltage level. Thus, the output terminal D4 is also discharged because the third node D3 and the output terminal D4 are coupled.

Since the input signal INPUT is in a high level, the control signal S1 of the buffer circuit 210 also becomes a high level. Thus, the second switch P01 becomes turned off. Here, a voltage level of the control signal S1 supplied to the gate of the second switch P01 is determined depending on an internal voltage supplied to the second inverter I2 (for example, Vcc).

Meanwhile, in case where the internal voltage does not maintain a high voltage level and becomes a low voltage level, the voltage level of a control signal S1 of the buffer circuit 210 is also lowered, and so the second switch P01 may be turned on. More particularly, because of the first switch N04, a certain voltage is supplied to the first node D1 coupled to the drain of the second switch P01. For example, it is assumed that the threshold voltage of the first switch N04 is −2.8 V and the threshold voltage of the second switch P01 is 0.8 V. If voltage of 0 V is supplied to the gate of the first switch N04, voltage of 2.8 V is supplied to the first node D1. Here, if the voltage level of the control signal S1 drops and becomes 2.3 V, the second switch P01 is turned on, and so voltage of 0.5 V is supplied to the second node D2. When the voltage of the second node D2 is 0.5 V, the block switch N03 is not turned on, and so the voltage of the second node D2 is not transferred to the output terminal D4. Accordingly, the output terminal D4 maintains the voltage of 0 V. Consequently, since the turn-on voltage of the first switch N04 does not rise, the voltage levels of the first and second nodes D1 and D2 do not rise. Accordingly, since a feedback loop is not formed in the boost circuit 220, the high voltage switch circuit 200 can normally output the block selection signal BLC of a low level.

As described above, although the level of an internal voltage is lowered and so the second switch P01 is turned on, the block switch N03 blocks a feedback loop from being formed in the boost circuit 220. Accordingly, although the level of the internal voltage is lowered, a feedback loop can be prevented from being formed in the boost circuit 220, and the output terminal D4 to which the block selection signal BLC is supplied can be discharged. Consequently, the boost circuit 220 can normally output the block selection signal BLC of a low level.

According to the present disclosure, operational reliability of a semiconductor device can be improved because the high voltage switch circuit is configured to normally operate both in a high voltage level and a low voltage level.

What is claimed is:

1. A high voltage switch circuit of a semiconductor device, comprising:
   a buffer circuit configured to output a control signal in response to an input signal; and
   a boost circuit including a first switch configured to transfer a voltage from a voltage supply node to a first node in response to a voltage level of an output terminal of the boost circuit, a second switch configured to transfer a voltage of the first node to a second node in response to the control signal, and a block switch configured to transfer a voltage of the second node to the output terminal in response to the voltage of the second node,
   wherein the block switch blocks a current path between the second node and the output terminal when the control signal falls from a high voltage level to a low voltage level while the high voltage switch circuit is inactivated.

2. The high voltage switch circuit of claim 1, wherein the buffer circuit comprises:
   a first inverter configured to invert the input signal and output an initial signal; and
   a second inverter configured to invert the initial signal and output the control signal.

3. The high voltage switch circuit of claim 1, wherein the second switch is a high voltage PMOS transistor.

4. The high voltage switch circuit of claim 1, wherein the block switch is a diode or an NMOS transistor.

5. The high voltage switch circuit of claim 4, wherein in case where the block switch is the NMOS transistor, the NMOS transistor is operated in response to the high voltage.

6. The high voltage switch circuit of claim 4, wherein the first switch is a negative NMOS transistor.

7. The high voltage switch circuit of claim 6, wherein the negative NMOS transistor is turned on when a gate of the negative NMOS transistor is in a floating state or when voltage higher than a negative (−) threshold voltage is supplied to the gate.

8. The high voltage switch circuit of claim 1, further comprising:
   an initial voltage setup circuit configured to determine an initial value of the block selection signal; and
   a discharge circuit configured to discharge the output terminal of the boost circuit in response to the input signal.

9. The high voltage switch circuit of claim 8, wherein the initial voltage setup circuit is a negative NMOS transistor operated in response to an operating signal and coupled between the buffer circuit and the output terminal.

10. The high voltage switch circuit of claim 9, wherein the operating signal remains in a high level when the high voltage switch circuit is activated, and remains in a low level when the high voltage switch circuit is inactivated.

11. The high voltage switch circuit of claim 9, wherein the negative NMOS transistor is turned on when a gate of the negative NMOS transistor is in a floating state or when voltage higher than a negative (−) threshold voltage is supplied to the gate.

12. The high voltage switch circuit of claim 8, wherein the discharge circuit is an NMOS transistor coupled between the initial voltage setup circuit and a ground terminal.

13. A high voltage switch circuit of a semiconductor device, comprising:
   a buffer circuit configured to generate an initial signal and a control signal in response an input signal;
   an initial voltage setup circuit configured to set up an initial voltage of an output terminal in response to the initial signal;
   a first switch configured to transfer a high voltage to a first node in response to a voltage level of the output terminal;
   a second switch configured to transfer a voltage level of the first node to a second node in response to the control signal;
   a block switch configured to block a current path between the second node and the output terminal in response to a voltage level of the high voltage; and
   a discharge circuit configured to discharge the output terminal via the initial voltage setup circuit in response to the input signal.

14. The high voltage switch circuit of claim 13, wherein the second switch is a high voltage PMOS transistor operated in response to the control signal.

15. The high voltage switch circuit of claim 13, wherein the block switch configured to block a current path between the second node and the output terminal when a voltage level of the high voltage is temporarily lowered.

16. The high voltage switch circuit of claim 13, wherein the block switch is an NMOS transistor operated in response to the high voltage and coupled between the second node and the output terminal.

17. The high voltage switch circuit of claim 13, wherein the first switch is a negative NMOS transistor operated in response to a voltage level of the output terminal, and coupled between the first node and a terminal from which the high voltage is outputted.

18. The high voltage switch circuit of claim 13, wherein the discharge circuit is an NMOS transistor coupled between a ground terminal and a terminal from which the initial signal is supplied.

* * * * *